United States Patent
Khlat (10) Patent No.: US 11,728,774 B2
(45) Date of Patent: Aug. 15, 2023

(54) AVERAGE POWER TRACKING POWER MANAGEMENT INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 46 days.

(21) Appl. No.: 17/163,642

(22) Filed: Feb. 1, 2021

(65) Prior Publication Data
US 2021/0265953 A1 Aug. 26, 2021

Related U.S. Application Data

(60) Provisional application No. 62/981,878, filed on Feb. 26, 2020.

(51) Int. Cl.
*H03F 1/02* (2006.01)
*H04L 5/00* (2006.01)
(Continued)

(52) U.S. Cl.
CPC .......... *H03F 1/0227* (2013.01); *H04L 5/0007* (2013.01); *H04W 52/36* (2013.01);
(Continued)

(58) Field of Classification Search
CPC ............. H03F 1/0227; H03F 2200/102; H03F 2200/451; H04L 5/0007; H04L 27/2601; H04W 52/36; H04W 52/52
See application file for complete search history.

(56) References Cited

U.S. PATENT DOCUMENTS

| 5,510,753 A | 4/1996 | French |
| 5,838,732 A | 11/1998 | Carney |

(Continued)

FOREIGN PATENT DOCUMENTS

| CN | 103916093 A | 7/2014 |
| CN | 105322894 A | 2/2016 |

(Continued)

OTHER PUBLICATIONS

Wan, F. et al., "Negative Group Delay Theory of a Four-Port RC-Network Feedback Operational Amplifier," IEEE Access, vol. 7, Jun. 13, 2019, IEEE, 13 pages.

(Continued)

*Primary Examiner* — Aristocratis Fotakis
(74) *Attorney, Agent, or Firm* — Withrow & Terranova, P.L.L.C.

(57) ABSTRACT

An average power tracking (APT) power management integrated circuit (PMIC) is provided. The APT PMIC is configured to generate an APT voltage to a power amplifier for amplifying a high modulation bandwidth (e.g., ≥200 MHz) radio frequency (RF) signal. The APT PMIC includes a voltage amplifier configured to generate an initial APT voltage and an offset capacitor configured to raise the initial APT voltage by a modulated offset voltage. The APT PMIC can be configured to modulate the initial APT voltage and the modulated offset voltage concurrently based on a time-variant APT target voltage. As a result, the APT PMIC can adapt the APT voltage very quickly between different voltage levels, thus making it possible to amplify a high modulation bandwidth radio frequency (RF) signal for transmission in a fifth-generation (5G) communication system.

20 Claims, 3 Drawing Sheets

(51) Int. Cl.
*H04W 52/52* (2009.01)
*H04W 52/36* (2009.01)

(52) U.S. Cl.
CPC ....... *H04W 52/52* (2013.01); *H03F 2200/102* (2013.01); *H03F 2200/451* (2013.01)

(56) References Cited

U.S. PATENT DOCUMENTS

| | | | |
|---|---|---|---|
| 6,107,862 A | 8/2000 | Mukainakano et al. |
| 6,141,377 A | 10/2000 | Sharper et al. |
| 6,141,541 A | 10/2000 | Midya et al. |
| 6,411,531 B1 | 6/2002 | Nork et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,942,651 B2 | 1/2015 | Jones |
| 8,947,161 B2 | 2/2015 | Khlat et al. |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,900,204 B2 | 2/2018 | Levesque et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,090,809 B1 * | 10/2018 | Khlat .................... H03F 1/0227 |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 10,756,675 B2 | 8/2020 | Leipold et al. |
| 10,862,431 B1 | 12/2020 | Khlat |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 2002/0167827 A1 | 11/2002 | Umeda et al. |
| 2003/0107428 A1 | 6/2003 | Khouri et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0052474 A1 | 3/2007 | Saito |
| 2007/0258602 A1 | 11/2007 | Vepsalainen et al. |
| 2007/0290748 A1 | 12/2007 | Woo et al. |
| 2008/0116960 A1 | 5/2008 | Nakamura |
| 2008/0231358 A1 | 9/2008 | Maemura |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0283534 A1 | 11/2010 | Pierdomenico |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Powers et al. |
| 2012/0200435 A1 | 8/2012 | Ngo et al. |
| 2012/0281597 A1 | 11/2012 | Khlat et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0169427 A1 | 6/2014 | Asenio et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0213196 A1 | 7/2014 | Anger et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0155836 A1 | 6/2015 | Midya et al. |

(56) References Cited

U.S. PATENT DOCUMENTS

| | | |
|---|---|---|
| 2015/0188432 A1 | 7/2015 | Vannorsdel et al. |
| 2015/0234402 A1 | 8/2015 | Kay et al. |
| 2015/0236652 A1 | 8/2015 | Vang et al. |
| 2015/0236654 A1 | 8/2015 | Jiang et al. |
| 2015/0236729 A1 | 8/2015 | Peng et al. |
| 2015/0236877 A1 | 8/2015 | Peng et al. |
| 2015/0280652 A1 | 10/2015 | Cohen |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1* | 3/2016 | Lee .................. H03F 3/211 |
| | | 330/297 |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0164550 A1 | 6/2016 | Pilgram |
| 2016/0164551 A1* | 6/2016 | Khlat .................. H03F 3/19 |
| | | 330/297 |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0249300 A1 | 8/2016 | Tsai et al. |
| 2016/0294587 A1 | 10/2016 | Jiang et al. |
| 2017/0005619 A1 | 1/2017 | Khlat |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1* | 2/2018 | Khlat .................. H03G 3/3036 |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1* | 12/2018 | Balteanu .............. H03F 1/0238 |
| 2019/0028060 A1 | 1/2019 | Jo et al. |
| 2019/0044480 A1* | 2/2019 | Khlat .................. H03F 3/213 |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222175 A1* | 7/2019 | Khlat .................. H03F 3/189 |
| 2019/0222178 A1 | 7/2019 | Khlat et al. |
| 2019/0229623 A1 | 7/2019 | Tsuda et al. |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0319584 A1* | 10/2019 | Khlat .................. H03F 3/19 |
| 2019/0386565 A1* | 12/2019 | Rosolowski ......... H02M 3/1584 |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0127608 A1 | 4/2020 | Khlat |
| 2020/0127625 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0313622 A1* | 10/2020 | Eichler .................. H03F 3/195 |
| 2020/0321848 A1 | 10/2020 | Khlat |
| 2020/0321917 A1* | 10/2020 | Nomiyama ............. H03G 3/30 |
| 2020/0328720 A1 | 10/2020 | Khlat |
| 2020/0336105 A1 | 10/2020 | Khlat |
| 2020/0336111 A1 | 10/2020 | Khlat |
| 2020/0350865 A1 | 11/2020 | Khlat |
| 2020/0382061 A1 | 12/2020 | Khlat |
| 2020/0382066 A1 | 12/2020 | Khlat |
| 2021/0036604 A1 | 2/2021 | Khlat et al. |
| 2021/0159590 A1 | 5/2021 | Na et al. |
| 2021/0175896 A1 | 6/2021 | Melanson et al. |
| 2021/0184708 A1 | 6/2021 | Khlat |
| 2021/0194515 A1 | 6/2021 | Go et al. |
| 2021/0194517 A1* | 6/2021 | Mirea .................. H03F 3/24 |
| 2021/0194522 A1 | 6/2021 | Stockert et al. |
| 2021/0211108 A1 | 7/2021 | Khlat |
| 2021/0226585 A1 | 7/2021 | Khlat |
| 2021/0234513 A1 | 7/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |

FOREIGN PATENT DOCUMENTS

| | | |
|---|---|---|
| CN | 105680807 A | 6/2016 |
| CN | 106208974 A | 12/2016 |
| CN | 106209270 A | 12/2016 |
| CN | 106877824 A | 6/2017 |
| CN | 107093987 A | 8/2017 |
| EP | 3174199 A2 | 5/2012 |
| JP | H03104422 A | 5/1991 |
| WO | 2018182778 A1 | 10/2018 |
| WO | 2020206246 A1 | 10/2020 |
| WO | 2021016350 A1 | 1/2021 |
| WO | 2021046453 A1 | 3/2021 |

OTHER PUBLICATIONS

Notice of Allowance for U.S. Appl. No. 16/834,049, dated Jun. 24, 2021, 8 pages.
Quayle Action for U.S. Appl. No. 16/589,940, dated Dec. 4, 2020, 8 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.

(56) References Cited

OTHER PUBLICATIONS

Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Notice of Allowance for U.S. Appl. No. 16/246,859, dated Sep. 18, 2020, 8 pages.
Final Office Action for U.S. Appl. No. 16/284,023, dated Nov. 3, 2020, 7 pages.
Quayle Action for U.S. Appl. No. 16/421,905, dated Aug. 25, 2020, 5 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Non-Final Office Action for U.S. Appl. No. 16/774,060, dated Aug. 17, 2020, 6 pages.
Notice of Allowance for U.S. Appl. No. 16/122,611, dated Dec. 1, 2020, 9 pages.
Chen, S. et al., "A 4.5 µW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.
Ying, K. et al., "A Wideband Envelope Detector with Low Ripple and High Detection Speed," 2018 IEEE International Symposium on Circuits and Systems (ISCAS), May 27-30, 2018, IEEE, 5 pages.
Notice of Allowance for U.S. Appl. No. 17/011,313, dated Nov. 4, 2021, 8 pages.
Non-Final Office Action for U.S. Appl. No. 16/597,952, dated Nov. 10, 2021, 9 pages.
Quayle Action for U.S. Appl. No. 16/855,154, dated Oct. 25, 2021, 6 pages.
Notice of Allowance for U.S. Appl. No. 17/115,982, dated Nov. 12, 2021, 8 pages.
Non-Final Office Action for U.S. Appl. No. 17/126,561, dated Oct. 14, 2021, 6 pages.
Non-Final Office Action for U.S. Appl. No. 17/073,764, dated Dec. 24, 2021, 22 pages.
International Search Report and Written Opinion for International Patent Application No. PCT/US2021/052151, dated Jan. 4, 2022, 16 pages.
Notice of Allowance for U.S. Appl. No. 15/964,762 dated Mar. 18, 2019, 7 pages.
Non-Final Office Action for U.S. Appl. No. 16/263,316, dated Dec. 23, 2019, 10 pages.
Final Office Action for U.S. Appl. No. 16/263,316, dated May 13, 2020, 10 pages.
Non-Final Office Action for U.S. Appl. No. 16/263,316, dated Jul. 17, 2020, 4 pages.
Non-Final Office Action for U.S. Appl. No. 16/263,316, dated Nov. 24, 2020, 4 pages.
Notice of Allowance for U.S. Appl. No. 16/263,316, dated Mar. 30, 2021, 7 pages.
Final Office Action for U.S. Appl. No. 16/807,575, dated May 4, 2022, 12 pages.
Notice of Allowance for U.S. Appl. No. 16/689,236 dated Jun. 9, 2021, 7 pages.
Non-Final Office Action for U.S. Appl. No. 16/775,554, dated Jun. 14, 2021, 5 pages.
Non-Final Office Action for U.S. Appl. No. 16/597,952, dated May 26, 2021, 7 pages.
Notice of Allowance for U.S. Appl. No. 16/582,471, dated Jun. 22, 2021, 9 pages.
Notice of Allowance for U.S. Appl. No. 16/582,471, dated Feb. 1, 2022, 9 pages.
Non-Final Office Action for U.S. Appl. No. 16/807,575, dated Jan. 31, 2022, 12 pages.
International Search Report and Written Opinion for International Patent Application No. PCT/US2021/050892, dated Jan. 5, 2022, 20 pages.

(56) References Cited

OTHER PUBLICATIONS

International Search Report and Written Opinion for International Patent Application No. PCT/US2021/054141 dated Jan. 25, 2022, 15 pages.

Non-Final Office Action for U.S. Appl. No. 17/032,553, dated Mar. 21, 2022, 4 pages.

International Search Report and Written Opinion for International Patent Application No. PCT/US2021/052830, dated Jan. 24, 2022, 13 pages.

Advisory Action for U.S. Appl. No. 16/807,575, dated Jul. 28, 2022, 3 pages.

Notice of Allowance for U.S. Appl. No. 16/807,575, dated Aug. 19, 2022, 8 pages.

Notice of Allowance for U.S. Appl. No. 17/148,064, dated Aug. 18, 2022, 8 pages.

Final Office Action for U.S. Appl. No. 17/032,553, dated Jul. 29, 2022, 6 pages.

Final Office Action for U.S. Appl. No. 17/073,764, dated Jun. 1, 2022, 22 pages.

Advisory Action for U.S. Appl. No. 17/073,764, dated Aug. 23, 2022, 3 pages.

Extended European Search Report for European Patent Application No. 22153526.3, dated Jul. 13, 2022, 9 pages.

Written Opinion for International Patent Application No. PCT/US2021/052830, dated Nov. 3, 2022, 7 pages.

International Preliminary Report on Patentability for International Patent Application No. PCT/US2021/052151, dated Oct. 13, 2022, 21 pages.

International Preliminary Report on Patentability for International Patent Application No. PCT/US2021/054141, dated Sep. 29, 2022, 20 pages.

Non-Final Office Action for U.S. Appl. No. 17/146,765, dated Sep. 7, 2022, 10 pages.

Notice of Allowance for U.S. Appl. No. 17/032,553, dated Oct. 11, 2022, 7 pages.

Non-Final Office Action for U.S. Appl. No. 17/073,764, dated Sep. 30, 2022, 13 pages.

Final Office Action for U.S. Appl. No. 17/073,764, dated Mar. 3, 2023, 14 pages.

International Preliminary Report on Patentability for International Patent Application No. PCT/US2021/052830, dated Feb. 20, 2023, 21 pages.

Advisory Action for U.S. Appl. No. 17/073,764, dated May 26, 2023, 3 pages.

First Office Action for Chinese Patent Application No. 202010083654.0, dated May 12, 2023.

\* cited by examiner

ID CIRCUIT

AVERAGE POWER TRACKING POWER MANAGEMENT INTEGRATED CIRCUIT

RELATED APPLICATIONS

This application claims the benefit of provisional patent application Ser. No. 62/981,878, filed Feb. 26, 2020, the disclosure of which is hereby incorporated herein by reference in its entirety.

FIELD OF THE DISCLOSURE

The technology of the disclosure relates generally to an average power tracking (APT) power management integrated circuit (PMIC).

BACKGROUND

Fifth-generation (5G) new radio (NR) (5G-NR) wireless communication systems have been widely regarded as the next wireless communication standards beyond the current third-generation (3G) communication standards, such as wideband code division multiple access (WCDMA), and fourth-generation (4G) communication standards, such as long-term evolution (LTE). The 5G-NR wireless communication system is expected to provide a significantly higher data rate, improved coverage range, enhanced signaling efficiency, and reduced latency compared to wireless communication systems based on the 3G and 4G communication standards. Moreover, the 5G-NR communication system is an orthogonal frequency division multiplexing (OFDM) based wireless system designed to operate across a wide range of radio frequency (RF) bands, which include a low-band (below 1 GHz), a mid-band (1 GHz to 6 GHz), and a high-band (above 24 GHz).

Figure 1:
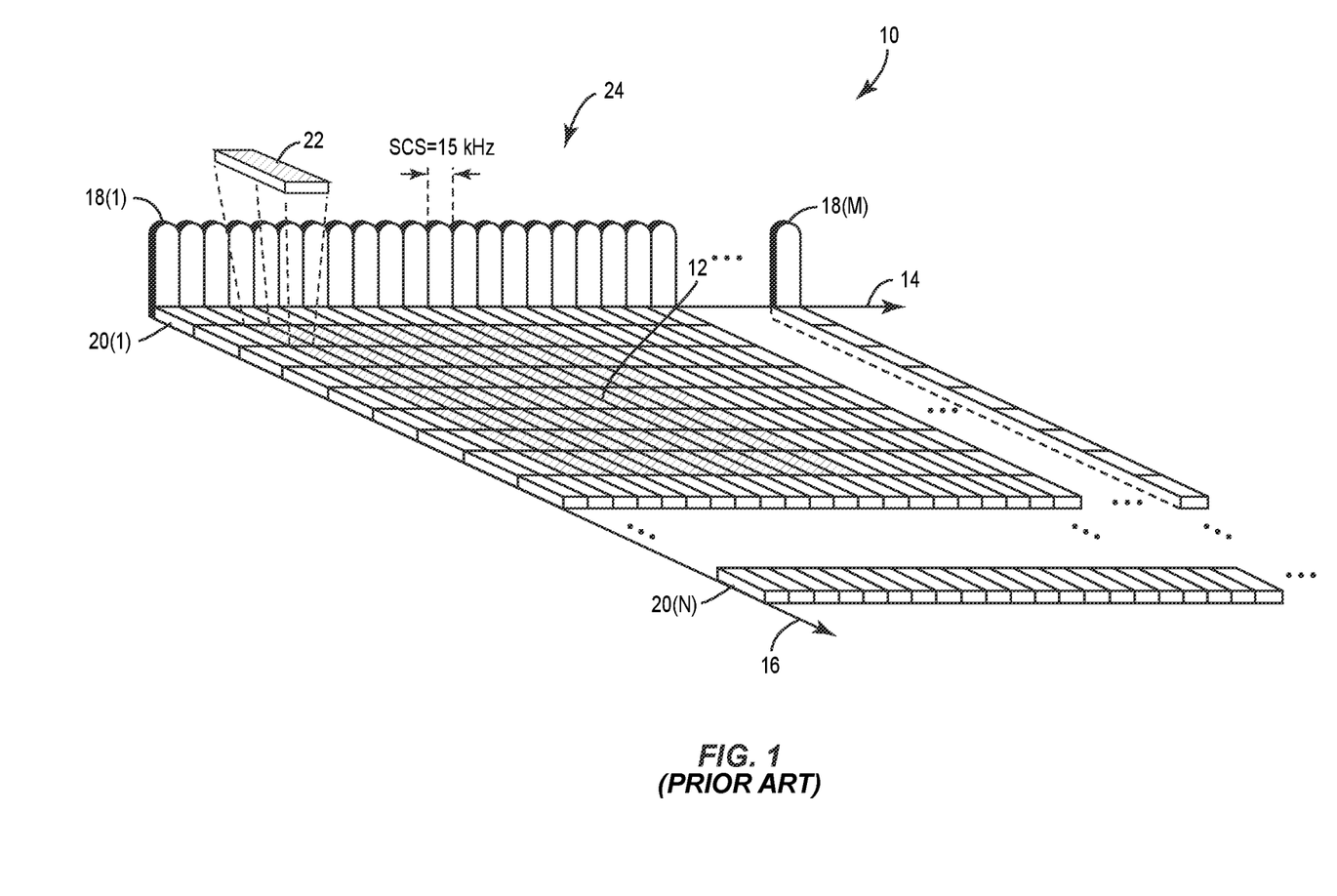
FIG. 1 is a schematic diagram of an exemplary orthogonal frequency division multiplexing (OFDM) time-frequency grid illustrating at least one resource block (RB)

FIG. 1 is a schematic diagram of an exemplary OFDM time-frequency grid 10 illustrating at least one reserve block (RB 12). The OFDM time-frequency grid 10 includes a frequency axis 14 representing a frequency domain and a time axis 16 representing a time domain. Along the frequency axis 14, there are a number of subcarriers 18(1)-18(M). The subcarriers 18(1)-18(M) are orthogonally separated from each other by a subcarrier spacing (SCS) of 15 KHz, for example. Along the time axis 16, there are a number of OFDM symbols 20(1)-20(N). Each of the OFDM symbols 20(1)-20(N) is separated by a cyclic prefix (CP) (not shown) configured to act as a guard band to help overcome inter-symbol interference (ISI) between the OFDM symbols 20(1)-20(N). In the OFDM time-frequency grid 10, each intersection of the subcarriers 18(1)-18M) and the OFDM symbols 20(1)-20(N) defines a resource element (RE) 22.

In a 5G-NR communication system, an RF signal 24 can be modulated into multiple subcarriers among the subcarriers 18(1)-18(N) in the frequency domain (along the frequency axis 14) and multiple OFDM symbols among the OFDM symbols 20(1)-20(N) in the time domain (along the time axis 16). The table (Table 1) below summarizes OFDM configurations supported by the 5G-NR communication system.

TABLE 1

| SCS (KHz) | Slot Length (μs) | # of Slots per Subframe | CP (μs) | OFDM Symbol Duration (μs) | Modulation Bandwidth (MHz) |
|---|---|---|---|---|---|
| 15 | 1000 | 1 | 4.69 | 71.43 | 50 |
| 30 | 500 | 2 | 2.34 | 35.71 | 100 |
| 60 | 250 | 4 | 1.17 | 17.86 | 200 |
| 120 | 125 | 8 | 0.59 | 8.93 | 400 |

In the 5G-NR communication system, the RF signal 24 is typically modulated with a high modulation bandwidth in excess of 200 MHz. In this regard, according to Table 1, the SCS will be 60 KHz and a transition settling time between two consecutive OFDM symbols among the OFDM symbols 20(1)-20(N) (e.g., amplitude change of the RF signal) needs to be less than or equal to the CP duration of 1.17 μs.

SUMMARY

Embodiments of the disclosure relate to an average power tracking (APT) power management integrated circuit (PMIC). The APT PMIC is configured to generate an APT voltage to a power amplifier for amplifying a high modulation bandwidth (e.g., ≥200 MHz) radio frequency (RF) signal. The APT PMIC includes a voltage amplifier configured to generate an initial APT voltage and an offset capacitor configured to raise the initial APT voltage by a modulated offset voltage. The APT PMIC can be configured to modulate the initial APT voltage and the modulated offset voltage concurrently based on a time-variant APT target voltage. As a result, the APT PMIC can adapt the APT voltage very quickly between different voltage levels, thus making it possible to amplify a high modulation bandwidth radio frequency (RF) signal for transmission in a fifth-generation (5G) communication system.

In one aspect, an APT PMIC is provided. The APT PMIC includes a voltage amplifier configured to generate an initial APT voltage at a voltage output based on a time-variant APT target voltage and a supply voltage. The APT PMIC also includes an offset capacitor coupled between an output of the voltage amplifier and the voltage output and is configured to raise the initial APT voltage by a modulated offset voltage to generate an APT voltage at the voltage output. The APT PMIC also includes a control circuit configured to cause the modulated offset voltage to be generated across the offset capacitor based on the time-variant APT target voltage within a predefined transition window.

In another aspect, an APT power management apparatus is provided. The APT power management apparatus includes an APT PMIC. The APT PMIC includes a voltage amplifier configured to generate an initial APT voltage at a voltage output based on a time-variant APT target voltage and a supply voltage. The APT PMIC also includes an offset capacitor coupled between an output of the voltage amplifier and the voltage output and is configured to raise the initial APT voltage by a modulated offset voltage to generate an APT voltage at the voltage output. The APT PMIC also includes a control circuit configured to cause the modulated offset voltage to be generated across the offset capacitor based on the time-variant APT target voltage within a predefined transition window.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an average power tracking (APT) power management integrated circuit (PMIC). The APT PMIC is configured to generate an APT voltage to a power amplifier for amplifying a high modulation bandwidth (e.g., 200 MHz) radio frequency (RF) signal. The APT PMIC includes a voltage amplifier configured to generate an initial APT voltage and an offset capacitor configured to raise the initial APT voltage by a modulated offset voltage. The APT PMIC can be configured to modulate the initial APT voltage and the modulated offset voltage concurrently based on a time-variant APT target voltage. As a result, the APT PMIC can adapt the APT voltage very quickly between different voltage levels, thus making it possible to amplify a high modulation bandwidth radio frequency (RF) signal for transmission in a fifth-generation (5G) communication system.

Figure 2:
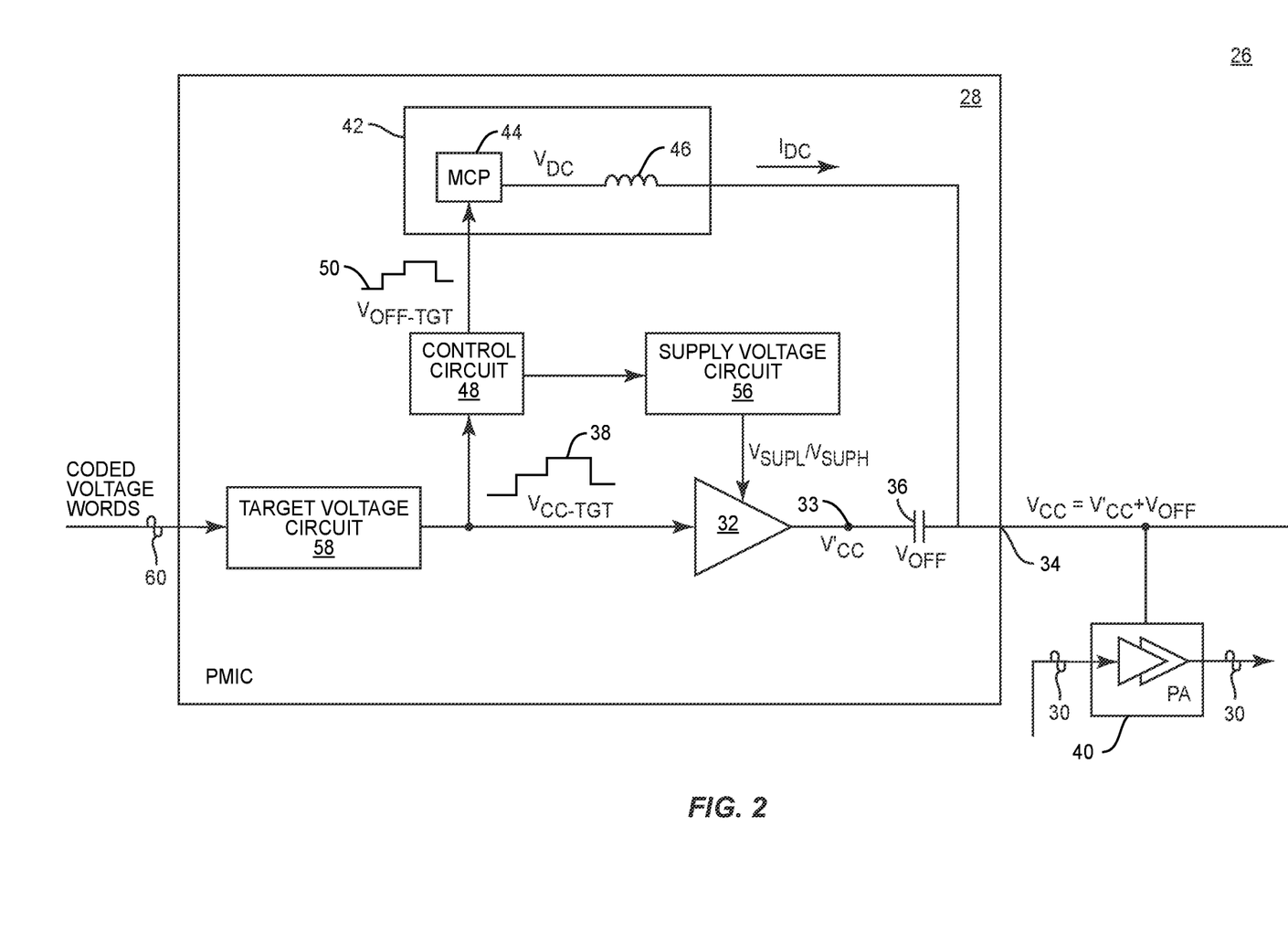
FIG. 2 is a schematic diagram of an exemplary average power tracking (APT) power management apparatus wherein an APT power management integrated circuit (PMIC) is configured according to an embodiment of the present disclosure to support quick APT voltage adaptation for amplifying a high modulation bandwidth radio frequency (RF) signal.

In this regard, FIG. 2 is a schematic diagram of an exemplary APT power management apparatus 26 wherein an APT PMIC 28 is configured according to an embodiment of the present disclosure to support quick APT voltage adaptation for amplifying a high modulation bandwidth RF signal 30. The APT PMIC 28 includes a voltage amplifier 32 having an output 33 coupled to a voltage output 34 via an offset capacitor 36. The voltage amplifier 32 and the offset capacitor 36 are configured to collectively generate an APT voltage $V_{CC}$ at the voltage output 34 based on a time-variant APT target voltage $V_{CC\text{-}TGT}$ that defines a time-variant voltage target 38. Specifically, the voltage amplifier 32 generates an initial APT voltage $V'_{CC}$ at the output 33 and the offset capacitor 36 is configured to raise the initial APT voltage $V'_{CC}$ generated by the voltage amplifier 32 by a modulated offset voltage $V_{OFF}$. As a result, the APT PMIC 28 will output the APT voltage $V_{CC}$ that equals a sum of the initial APT voltage $V'_{CC}$ and the modulated voltage $V_{OFF}$ ($V_{CC}=V'_{CC}+V_{OFF}$) for amplifying the high modulation bandwidth RF signal 30.

The APT power management apparatus 26 includes a power amplifier 40 coupled to the voltage output 34. The power amplifier 40 is configured to amplify the high modulation bandwidth RF signal 30 based on the APT voltage $V_{CC}$. In a non-limiting example, the high modulation bandwidth RF signal 30 is modulated with at least 200 MHz modulation bandwidth for transmission in a 5G communications system. In this regard, the high modulation bandwidth RF signal 30 can be modulated across the orthogonal frequency division multiplexing (OFDM) symbols 20(1)-20 (N) in FIG. 1. Thus, according to Table 1, the high modulation bandwidth RF signal 30 will be modulated based on 60 KHz subcarrier spacing (SCS). Accordingly, the transition settling time between any two consecutive OFDM symbols of the high modulation bandwidth RF signal 30 needs to be less than or equal to the cyclic prefix (CP) duration of 1.17 ρs (referred to as "a predefined transition window" hereinafter).

As discussed in detail below, the APT PMIC 28 can be configured to modulate the initial APT voltage $V'_{CC}$ and the modulated offset voltage $V_{OFF}$ concurrently based on the time-variant APT target voltage $V_{CC\text{-}TGT}$. As further illustrated later in FIG. 3, the APT PMIC 28 can adapt the APT voltage $V_{CC}$ from one level to another in accordance with the time-variant voltage target 38. More importantly, the APT PMIC 28 can adapt the APT voltage $V_{CC}$ from one level to another within the predefined transition window. As a result, the APT PMIC 28 can operate with the power amplifier 40 to amplify the high modulation bandwidth RF signal 30 for transmission in a 5G communication system.

The APT PMIC 28 can include a tracker circuit 42, which includes a multi-level charge pump (MCP) 44 and a power inductor 46. The MCP 44 is configured to generate a low-frequency voltage $V_{DC}$ (e.g., a constant voltage) at a number of voltage levels. The power inductor 46 is coupled between the MCP 44 and the voltage output 34. The power inductor 46 is configured to induce a low-frequency current $I_{DC}$ (e.g., a constant current) based on the low-frequency voltage $V_{DC}$ to thereby charge the offset capacitor 36 to the modulated offset voltage $V_{OFF}$ during the predefined transition window. Notably, the modulated offset voltage $V_{OFF}$ can be expressed as in an equation (Eq. 1) below.

$$\Delta V_{OFF} = I_{DC}/C \qquad (\text{Eq. 1})$$

In the equation (Eq. 1) above, C represents a capacitance of the offset capacitor 36. It can be seen from Eq. 1 that, when the low-frequency current $I_{DC}$ is held constant, the smaller the capacitance C, the faster the offset capacitor 36 can be charged to a specific level of the modulated offset voltage $V_{OFF}$. As such, the capacitance C of the offset capacitor 36 is so determined to ensure that the offset capacitor 36 can be charged to the modulated offset voltage $V_{OFF}$ by the low-frequency current $I_{DC}$ within the predefined transition window. In a non-limiting example, the capacitance C of the offset capacitor 36 is approximately 2.2 microfarad (2.2 μF).

The APT PMIC 28 also includes a control circuit 48, which can be a microcontroller, a microprocessor, of a field-programmable gate array (FPGA), as an example. The control circuit 48 is configured to receive the time-variant APT target voltage $V_{CC\text{-}TGT}$ and cause the modulated offset voltage $V_{OFF}$ to be generated across the offset capacitor 36 based on the time-variant APT target voltage $V_{CC\text{-}TGT}$ within the predefined transition window. The control circuit 48 may be configured to determine a time-variant offset target voltage $V_{OFF\text{-}TGT}$ based on the time-variant APT target voltage $V_{CC\text{-}TGT}$. The time-variant offset voltage $V_{OFF\text{-}TGT}$ is associated with a time-variant offset voltage target 50 that is proportionally related to the time-variant voltage target 38.

In a non-limiting example, the control circuit 48 can derive the time-variant offset voltage $V_{OFF\text{-}TGT}$ from the time-variant APT voltage $V_{CC\text{-}TGT}$ based on a programmable gain coefficient K (0<K<1). Accordingly, the control circuit 48 can cause the modulated offset voltage $V_{OFF}$ to be generated based on the time-variant offset target voltage $V_{OFF\text{-}TGT}$ within the predefined transition window. In a specific but non-limiting example, the control circuit 48 can control the MCP 44 to adjust the low-frequency voltage $V_{DC}$ according to rises and falls of the time-variant offset voltage target 50 to thereby adjust the low-frequency current $I_{DC}$. Thus, according to the equation (Eq. 1), the control circuit 48 can cause the modulated offset voltage $V_{OFF}$ to increase or decrease accordingly.

Figure 3:
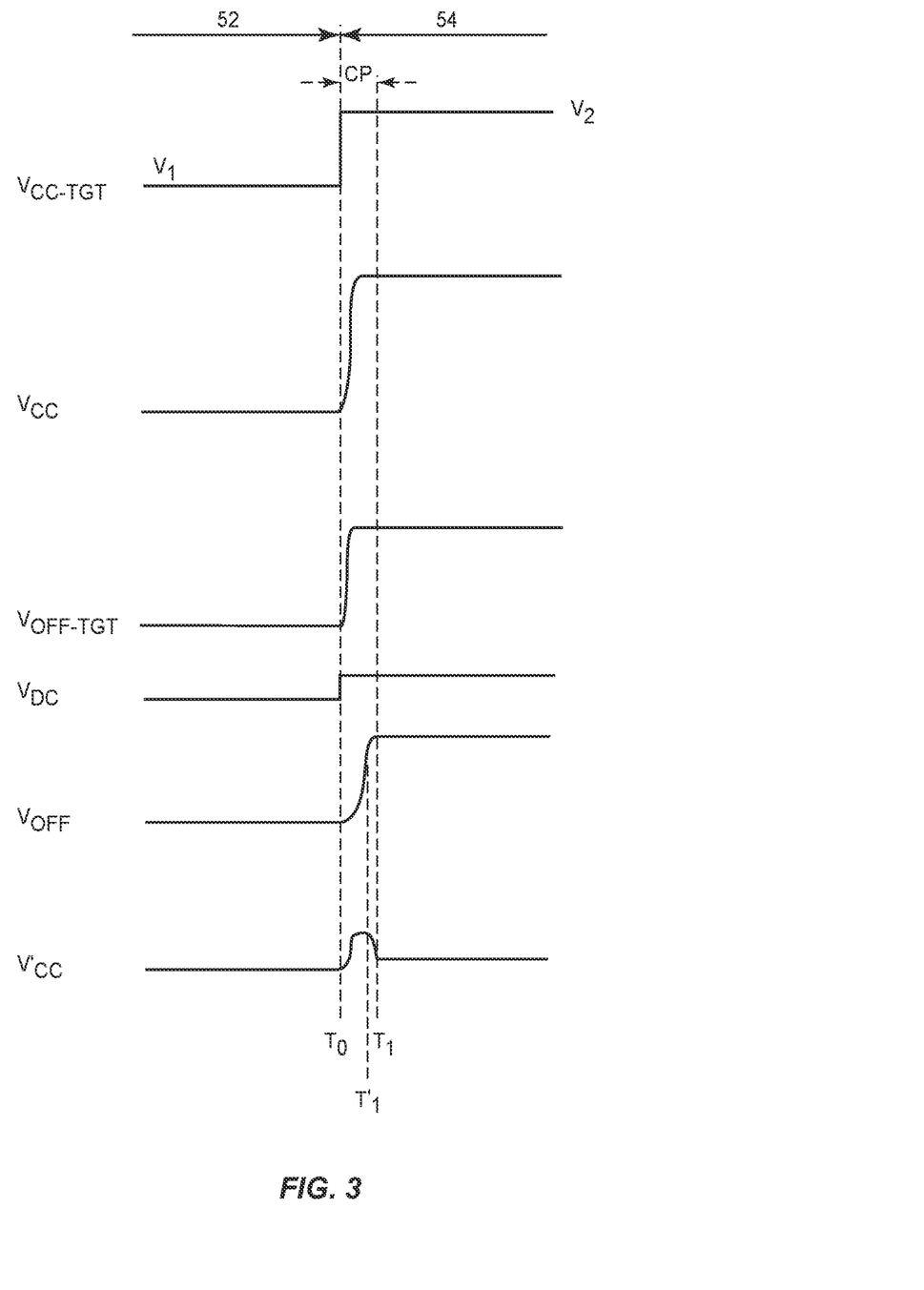
FIG. 3 is a graphic diagram providing an exemplary illustration as to how the APT PMIC in FIG. 2 can be configured to quickly adapt the APT voltage between two consecutive OFDM symbols.

FIG. 3 is a graphic diagram providing an exemplary illustration as to how the APT PMIC 28 in FIG. 2 can be configured to quickly adapt the APT voltage $V_{CC}$ between two consecutive OFDM symbols 52 and 54. As shown in FIG. 3, a transition from the preceding OFDM symbol 52 to the succeeding OFDM symbol 54 begins at time $T_0$ and ends at time $T_1$. In this regard, time $T_0$ and $T_1$ collectively define the CP (a.k.a. predefined transition window) between the two consecutive OFDM symbols 52 and 54. Accordingly, the APT PMIC 28 must adapt the sum of the APT voltage $V_{CC}$ and the modulated voltage $V_{OFF}$ ($V_{CC}+V_{OFF}$), which is outputted to the power amplifier 40 in FIG. 2, on or before time $T_1$.

In a non-limiting example, at time $T_0$, the control circuit 48 receives the time-variant APT target voltage $V_{CC\text{-}TGT}$ that indicates a rise of the APT voltage $V_{CC}$ from a first voltage level $V_1$ (e.g., 1 V) to a second voltage level $V_2$ (e.g., 3.5 V) in the OFDM symbol 54. Accordingly, the control circuit 48 generates the time-variant offset target voltage $V_{OFF\text{-}TGT}$ that rises at time $T_0$. The control circuit 48 controls the MCP 44 to increase the low-frequency voltage $V_{DC}$ to thereby increase the low-frequency current $I_{DC}$. The control circuit 48 may determine the low-frequency voltage $V_{DC}$ based on an equation (Eq. 2) below.

$$V_{DC} \le (1-K)*V_{CC\text{-}TGT} - N_{headroom} \qquad (\text{Eq. 2})$$

In the equation (Eq. 2), K represents the programmable gain coefficient and $N_{headroom}$ represents a headroom voltage of the voltage amplifier 32. For example, if the time-variant APT target voltage $V_{CC\text{-}TGT}$ rises from 1 V to 3.5 V, K equals 0.7, and $N_{headroom}$ equals 0.3 V, the control circuit 48 can control the MCP 44 to generate the low-frequency voltage $V_{DC}$ at approximately 0.75 V according to Eq. 2.

Concurrent to increasing the modulated offset voltage $V_{OFF}$, the voltage amplifier 32 also increases the initial APT voltage $V'_{CC}$. As such, it is possible to ramp up the APT voltage $V_{CC}$ on or before time $T_1$. Notably, at time T0, the voltage amplifier 32 may have to ramp up the initial APT voltage $V'_{CC}$ while the offset capacitor 36 is being charged by the low-frequency current $I_{DC}$ toward the modulated offset voltage $V_{OFF}$. When the modulated offset voltage $V_{OFF}$ increases to a sufficient level at time $T'_1$, the voltage amplifier 32 can start reducing the initial APT voltage $V'_{CC}$ to help improve operating efficiency.

With reference back to FIG. 2, the voltage amplifier 32 is biased by one of a lower supply voltage $V_{SUPL}$ and a higher supply voltage $V_{SUPH}$ ($V_{SUPH}>V_{SUPL}$) that are generated by a supply voltage circuit 56. The control circuit 48 may control the supply voltage circuit 56 to provide the higher supply voltage $V_{SUPH}$ to the voltage amplifier 32 at time $T_0$ to help ramp up the APT voltage $V_{CC}$ while the offset capacitor 36 is being charged. At time $T_1$, the control circuit 48 may control the supply voltage circuit 56 to provide the lower supply voltage $V_{SUPL}$ to the voltage amplifier 32 to help improve operating efficiency of the voltage amplifier 32.

The APT PMIC 28 can be configured to further include a target voltage circuit 58. In a non-limiting example, the target voltage circuit 58 receives a number of coded voltage words 60 each defining a respective level of the time-variant APT target voltage $V_{CC\text{-}TGT}$. For instance, in the example shown in FIG. 3, one of the coded voltage words 60 indicates the first voltage level $V_1$ (1 V) and another one of the coded voltage words 60 indicates the second voltage level $V_2$ (3.5 V). Accordingly, the target voltage circuit 58 can generate the time-variant APT target voltage $V_{CC\text{-}TGT}$ based on the coded voltage words 60.

Those skilled in the art will recognize improvements and modifications to the preferred embodiments of the present disclosure. All such improvements and modifications are considered within the scope of the concepts disclosed herein and the claims that follow.

What is claimed is:

1. An average power tracking (APT) power management integrated circuit (PMIC) comprising:
   a voltage amplifier configured to generate an initial APT voltage at a voltage output based on a time-variant APT target voltage and a supply voltage;
   an offset capacitor coupled between an output of the voltage amplifier and the voltage output and configured to raise the initial APT voltage by a modulated offset voltage to generate an APT voltage at the voltage output; and
   a control circuit configured to:
      cause the modulated offset voltage to be generated across the offset capacitor based on a time-variant offset target voltage derived from the time-variant APT target voltage; and
      cause the initial APT voltage and the modulated offset voltage to change concurrently at a start of a predefined transition window to thereby change the APT voltage to a voltage level indicated by the time-variant APT target voltage within the predefined transition window.

2. The APT PMIC of claim 1 wherein the predefined transition window corresponds to a cyclic prefix (CP) between two consecutive orthogonal frequency division multiplexing (OFDM) symbols.

3. The APT PMIC of claim 1 further comprising:
   a multi-level charge pump (MCP) configured to generate a low-frequency voltage at a plurality of voltage levels; and
   a power inductor coupled between the MCP and the voltage output and configured to induce a low-frequency current based on the low-frequency voltage to thereby charge the offset capacitor to the modulated offset voltage.

4. The APT PMIC of claim 3 wherein the offset capacitor has a capacitance determined to cause the offset capacitor to be charged to the modulated offset voltage by the low-frequency current within the predefined transition window.

5. The APT PMIC of claim 3 wherein the control circuit is further configured to control the MCP to adjust the low-frequency voltage to thereby adjust the low-frequency current for charging the offset capacitor.

6. The APT PMIC of claim 1 further comprising a target voltage circuit configured to:
   receive a plurality of coded voltage words each defining a respective level of the time-variant APT target voltage; and
   generate the time-variant APT target voltage based on the plurality of coded voltage words.

7. The APT PMIC of claim 6 wherein the control circuit is further configured to:
   determine the time-variant offset target voltage based on the time-variant APT target voltage; and
   cause the modulated offset voltage to be generated based on the time-variant offset target voltage within the predefined transition window.

8. The APT PMIC of claim 7 wherein the control circuit is further configured to scale the time-variant APT target voltage based on a programmable gain coefficient to generate the time-variant offset target voltage.

9. The APT PMIC of claim 1 further comprising a supply voltage circuit configured to generate a plurality of supply voltages, wherein the control circuit is further configured to control the supply voltage circuit to provide one of the plurality of supply voltages to the voltage amplifier as the supply voltage.

10. The APT PMIC of claim 1, wherein the control circuit is further configured to:
    determine that the time-variant APT target voltage indicates an increase of the APT voltage;
    cause the initial APT voltage and the modulated offset voltage to increase concurrently at the start of the predefined transition window; and
    cause the initial APT voltage to start decreasing prior to an end of the predefined transition window.

11. An average power tracking (APT) power management apparatus comprising an APT power management integrated circuit (PMIC), the APT PMIC comprising:
    a voltage amplifier configured to generate an initial APT voltage at a voltage output based on a time-variant APT target voltage and a supply voltage;
    an offset capacitor coupled between an output of the voltage amplifier and the voltage output and configured to raise the initial APT voltage by a modulated offset voltage to generate an APT voltage at the voltage output; and
    a control circuit configured to:
       cause the modulated offset voltage to be generated across the offset capacitor based on a time-variant offset target voltage derived from the time-variant APT target voltage; and
       cause the initial APT voltage and the modulated offset voltage to change concurrently at a start of a predefined transition window to thereby change the APT voltage to a voltage level indicated by the time-variant APT target voltage within the predefined transition window.

12. The APT power management apparatus of claim 11 further comprising a power amplifier configured to amplify a high modulation bandwidth radio frequency (RF) signal based on the APT voltage.

13. The APT power management apparatus of claim 12 wherein:
    the high modulation bandwidth RF signal is modulated across a plurality of orthogonal frequency division multiplexing (OFDM) symbols; and
    the predefined transition window corresponds to a cyclic prefix (CP) between any two consecutive OFDM symbols among the plurality of OFDM symbols.

14. The APT power management apparatus of claim 11 wherein the APT PMIC further comprises:
   a multi-level charge pump (MCP) configured to generate a low-frequency voltage at a plurality of voltage levels; and
   a power inductor coupled between the MCP and the voltage output and configured to induce a low-frequency current based on the low-frequency voltage to thereby charge the offset capacitor to the modulated offset voltage.

15. The APT power management apparatus of claim 14 wherein the offset capacitor has a capacitance determined to cause the offset capacitor to be charged to the modulated offset voltage by the low-frequency current within the predefined transition window.

16. The APT power management apparatus of claim 14 wherein the control circuit is further configured to control the MCP to adjust the low-frequency voltage to thereby adjust the low-frequency current for charging the offset capacitor.

17. The APT power management apparatus of claim 11 wherein the APT PMIC further comprises a target voltage circuit configured to:
   receive a plurality of coded voltage words each defining a respective level of the time-variant APT target voltage; and
   generate the time-variant APT target voltage based on the plurality of coded voltage words.

18. The APT power management apparatus of claim 17 wherein the control circuit is further configured to:
   determine the time-variant offset target voltage based on the time-variant APT target voltage; and
   cause the modulated offset voltage to be generated based on the time-variant offset target voltage within the predefined transition window.

19. The APT power management apparatus of claim 18 wherein the control circuit is further configured to scale the time-variant APT target voltage based on a programmable gain coefficient to generate the time-variant offset target voltage.

20. The APT power management apparatus of claim 11 wherein the APT PMIC further comprises a supply voltage circuit configured to generate a plurality of supply voltages, wherein the control circuit is further configured to control the supply voltage circuit to provide one of the plurality of supply voltages to the voltage amplifier as the supply voltage.

* * * * *